Jan. 13, 1959
G. D. BRUCE
2,869,000
MODIFIED BINARY COUNTER CIRCUIT
Filed Sept. 30, 1954
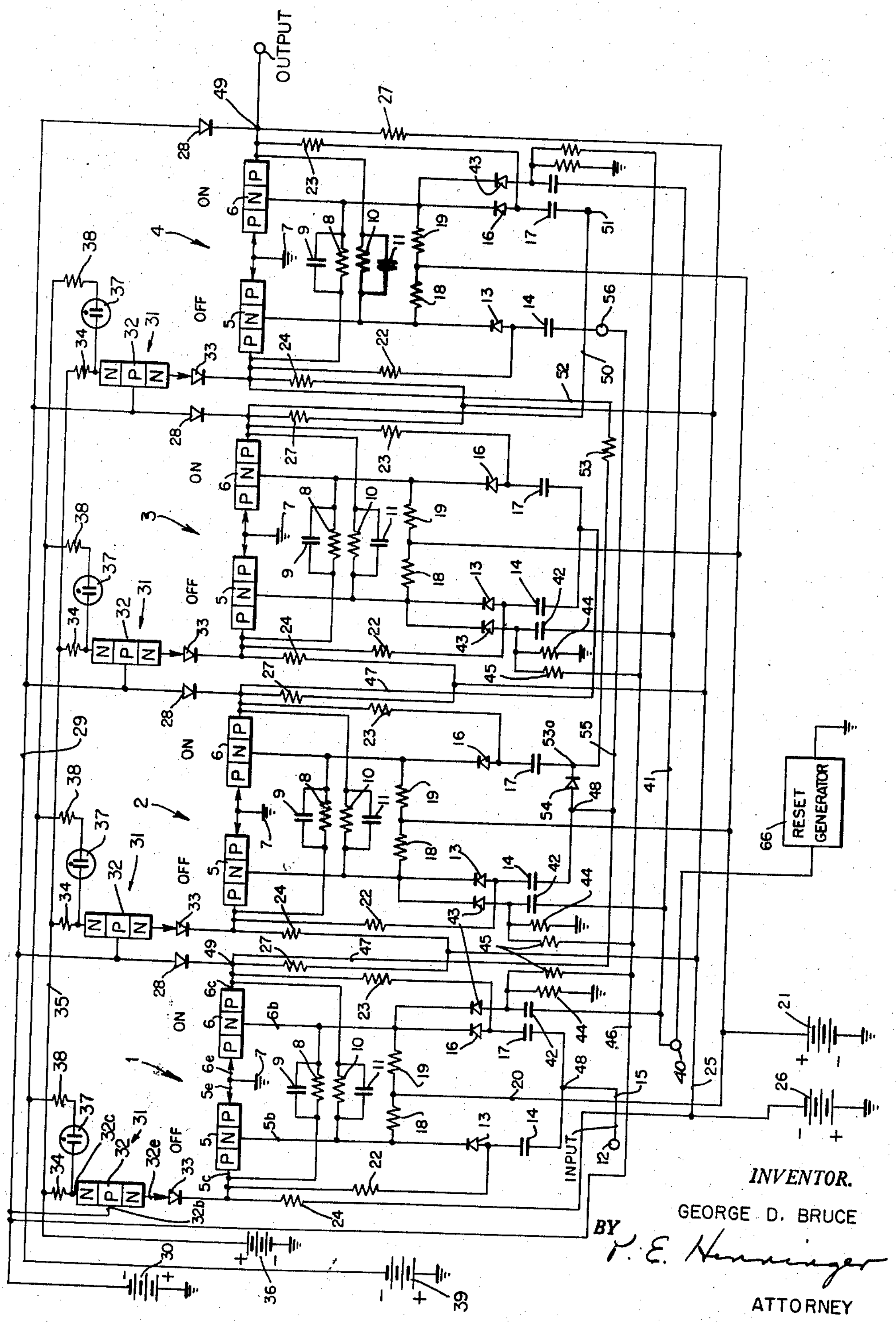
INVENTOR.
GEORGE D. BRUCE
BY R. E. Henninger
ATTORNEY United States Patent Office 2,869,000

Patented Jan. 13, 1959

2,869,000

MODIFIED BINARY COUNTER CIRCUIT

George D. Bruce, Wappingers Falls, N. Y., assignor to International Business Machines Corporation, New York, N. Y., a corporation of New York Application September 30, 1954, Serial No. 459,384

4 Claims. (Cl. 307—88.5)

This invention relates to a modified binary counter circuit. A binary counter circuit counts successive input electrical pulses in pairs, and produces an output pulse upon receipt of a number of pulses which is equal to a power of two. The circuit of the present invention is modified from strict binary operation to produce an output pulse upon receipt of a number of input pulses which differs from a power of two. In the particular circuit disclosed, the modification is such that the circuit counts ten input pulses and it may therefore be termed a decimal counter circuit.

A decimal counter circuit of the type concerned herein is shown and described in patent to Phelps, No. 2,584,811. Phelps shows a counter circuit of four stages, each stage consisting of a binary trigger circuit. Such a trigger circuit counts two input pulses, producing an output pulse on receipt of two input pulses. A counter circuit of four such stages connected in cascade would, in strict binary operation, produce an output pulse in response to the sixteenth input pulse. However, the Phelps circuit includes feedback arrangements for transferring pulses from the fourth stage to one of the earlier stages so as to make the circuit count ten pulses rather than sixteen.

Phelps uses vacuum tube trigger circuits for his four stages and utilizes a vacuum tube in the feedback connection which decimalizes the output of his circuit.

It is an object of the present invention to provide an improved modified binary counter circuit of the type described.

Another object of the invention is to provide an improved binary counter circuit employing transistor trigger circuits in its several stages.

Another object of the invention is to provide an improved feedback arrangement for modifying a binary counter circuit of the type described to produce non-binary output signals.

The foregoing objects of the invention are attained in the circuit described herein by providing, in each of the four stages, a transistor trigger circuit employing two junction transistors, each having an output electrode cross-coupled to an input electrode of the other. One output terminal of each stage is coupled to the input terminals of both transistors of the succeeding stage. The first three stages are typical binary trigger circuits, in that they produce a single output pulse for each pair of successive input pulses. The fourth stage is a latch circuit whose setting and resetting is controlled by the third and first trigger stages. The fourth stage is coupled back to the second stage, so that the counter is shifted from a sixteen count to a ten count, and this coupling includes a Harper gate, of the type shown in the U. S. patent to Harper, No. 2,580,771.

Other objects and advantages of the invention will become apparent from a consideration of the following specification and claims, taken together with the accompanying drawing.

In the drawing, the single figure is a wiring diagram of a decimal counter circuit embodying the invention.

The counter circuit includes four stages, generally indicated respectively by the reference numerals 1, 2, 3 and 4. For the most part, the various circuit elements in the four stages correspond exactly to their counterparts in the other stages. Where that correspondence exists, the same reference numerals have been applied to the corresponding circuit elements throughout the four stages. Where some difference appears, different reference numerals have been used. Only stage 1 is described in detail below. Each stage consists of a trigger circuit which is more completely described and claimed in the copending application of Robert A. Henle, Raymond W. Emery, George D. Bruce and Olin L. MacSorley, Serial No. 459,381, filed September 30, 1954, now Patent No. 2,861,200, issued November 18, 1958.

Referring now to stage 1, there are shown two PNP junction transistors 5 and 6 having emitter electrodes **5*e* and 6*e*, base electrodes 5*b* and 6*b*, and collector electrodes 5*c* and 6*c***.

The two emitters **5*e* and 6*e* are connected to ground at 7. Base 6*b* is cross-coupled to collector 5*c* through a resistor 8 and a parallel capacitor 9. Base 5*b* is similarly cross coupled to collector 6*c* through a resistor 10 and a parallel capacitor 11. Base 5*b* is connected through an input gate to an input terminal 48 of stage 1, and thence through a wire 15 to a main input terminal 12 of the counter. The input gate includes a diode 13, a capacitor 14 and a resistor 22 connected between collector 5*c* and the common junction of diode 13 and capacitor 14. Base 6*b* is also connected to input terminal 48 through an input gate including a diode 16, a capacitor 17, and a resistor 23 connected between collector 6*c* and the common junction of diode 16 and capacitor 17. Base electrodes 5*b* and 6*b* are connected through resistors 18 and 19 respectively to a wire 20 which leads to the positive terminal of a biasing battery 21**.

Collector **5*c* is connected through a load resistor 24 to a wire 25 leading to the negative terminal of a load supply battery 26. Collector 6*c* is similarly connected to the wire 25 through a load resistor 27**.

The minimum potential of collector electrode **6*c* is established by a clamp circuit which includes a diode 28, a wire 29 and a source of clamping potential indicated as a battery 30**.

The potential of collector electrode **5*c* is clamped by the action of a combined clamp and indicator circuit generally indicated by the reference numeral 31, and more fully disclosed and claimed in the copending application of Joseph C. Logue and Robert A. Henle, Serial No. 459,289, filed September 30, 1954, now Patent Number 2,772,410, issued November 27, 1956. The indicator circuit 31 includes an NPN junction transistor 32 having an emitter electrode 32*e*, a base electrode 32*b* and a collector electrode 32*c*. The emitter electrode 32*e* is connected to collector 5*c* through a diode 33. Base 32*b* is connected to wire 29. Collector 32*c* is connected through a load resistor 34 and a wire 35 to a load supply battery 36. Also connected to collector 32*c* is a neon glow lamp 37 in series with a resistor 38 and a lamp supply battery 39**.

Connected to the base 6b of transistor 6 is a reset signal input circuit which may be traced from a suitable reset signal generator 66 through a terminal 40, a wire 41, a capacitor 42 and a diode 43 to the base 6b. A resistor 44 is connected between the common junction of capacitor 42 and diode 43 on the one hand and ground on the other hand. Resistor 44 is provided to facilitate charging and discharging of capacitor 42. Another resistor 45 is connected between the same common junction and a wire 46 connected to wire 29 and thence to the negative terminal of battery 30. Resistor 45 and resistor 44 cooperate to bias the junction to a slightly negative potential, thereby ensuring that there is no flow through diode 43 except when the reset signal generator is transmitting signal pulses.

*Operation*

The trigger circuit of each stage has an Off condition in which the transistor 5 is not conducting and the transistor 6 is conducting. The source of signals connected to input terminal 12 may, for example, have a background or no-signal potential of −5 volts and a signal potential of 0 volts. The two clamping arrangements for the collectors 5c and 6c are constructed so that when either transistor is Off, its collector is at a potential of −5 volts. When either transistor is On, the collector potential is substantially the same as the emitter potential, since the transistor impedance is then very low. The emitters are always at ground potential.

When the trigger circuit of stage 1 is in its Off condition, the output terminal 49 is at 0 volts, which potential is communicated through resistor 23 to the junction between diode 16 and capacitor 17. The base 6b is likewise substantially at 0 volts, because of the low impedance of the transistor, so there is substantially no potential across the diode 16. The input terminal 48, in the absence of an incoming signal, is then at a potential of −5 volts, so that capacitor 17 is charged at a potential of 5 volts, with its upper terminal positive.

In the input gate for transistor 5, which is then Off, the potential of collector 5c (−5 volts) is communicated through resistor 22 to the junction between diode 13 and capacitor 14. The capacitor 14 then has no potential across it, since input terminal 48 is then also at −5 volts. However, base electrode 5b is only slightly positive so that diode 13 has a reverse bias across it of slightly more than 5 volts. This reverse bias is effective to block the next positive signal potential of 5 volts which is received at input terminal 48. That same positive signal potential, however, passes through capacitor 17 and diode 16 and is impressed on base electrode 6b, being aided by the 5 volt potential stored on capacitor 17.

In the zero condition of the counter circuit, all four stages are Off. The trigger stage 1 is shifted from this Off condition to an On condition by the first positive input pulse transmitted through input terminal 48 to the bases 5b and 6b of stage 1. This first positive input pulse is blocked from transistor 5, but at transistor 6 it swings the base positive and has the effect of cutting off that transistor. When transistor 6 cuts off, its collector electrode 6 swings to the negative potential established by battery 30 and clamping diode 28, and this negative swing is transmitted through resistor 10 and capacitor 11 to the base 5b, turning the transistor 5 On. When transistor 5 turns on, its collector 5c swings in a positive sense, and this positive potential is transmitted through resistor 8 and capacitor 9 to base 6b. However, transistor 6 is already Off, so that this positive potential has no effect at that time.

The trigger circuit of stage 1 is now in its On condition, with the transistor 6 turned Off and the transistor 5 turned On or conducting. Capacitor 14 is charged to a potential of substantially 5 volts, with its upper terminal positive. There is no potential across diode 13 nor across capacitor 17. Diode 16 is reversely biased with a potential of slightly more than 5 volts.

When a second positive input pulse is transmitted through terminal 12, it passes to input terminal 48. This second input pulse is blocked from the base 6b of transistor 6, but at base 5b of transistor 5 it is effective to swing the base positive and cut off that transistor. When transistor 5 cuts off, its collector 5c swings negatively, to the potential established by the indicator circuit 31, which serves as a clamping circuit. This negative potential is transmitted through resistor 8 and capacitor 9 to the base 6b, and is there effective to turn the transistor 6 On. When the transistor 6 turns On, its collector 6c and the output terminal 49 of stage 1 swing in a positive sense, and this positive signal pulse is transmitted through wire 47 to input terminal 48 of stage 2.

In a trigger circuit such as stage 1, the transistor 5 is sometimes spoken of as the counting transistor and the transistor 6 as the transmitting transistor.

Only the positive going pulses reaching the input terminal 48 of any stage are effective to trip that stage. Negative going pulses are blocked by the diodes 13 and 16. In stage 2, at the time the positive signal pulse is received from output terminal 49 of stage 1, transistor 5 is not conducting and transistor 6 is conducting.

In stage 2, the "no signal" negative potential from output terminal 49 of stage 1 is blocked from the lower terminal of capacitor 17 by a diode 54. However, an equivalent negative potential is supplied to the common junction 53a between diode 54 and capacitor 17, by a connection including a resistor 53 and a wire 52 from the collector electrode 5c of stage 4. Transistor 5 of stage 4 is normally Off, so that collector 5c is normally negative, at the collector clamp potential of −5 volts.

Transistor 5 of stage 4 has an input terminal 56 separate from the input terminal 51, the latter serving transistor 6 only. Terminal 56 is connected through wires 55 and 47 to the output terminal 49 of stage 1. Transistor 5 of stage 4 is normally Off, and its associated diode 13 is reversely biased as in the other stages, so that positive input pulses from the output terminal 49 of stage 1 are not usually effective to produce any response at base 5b of transistor 5 in stage 4.

The first signal received from stage 1 (second signal at terminal 12) is effective at stage 2 to turn transistor 6 Off, so that transistor 5 of stage 2 is switched On. This produces a negative output signal at the output terminal 49 of stage 2, but stage 3, like the other stages, does not respond to negative signals. Stage 2, therefore, remains in its On condition with its transistor 5 On and its transistor 6 Off until another input pulse is received from stage 1 (on the fourth input pulse to terminal 12), at which time stage 2 is again switched, turning transistor 5 Off and turning transistor 6 On, and producing a positive output pulse at terminal 49.

Reviewing, the first input pulse to stage 1 produces no positive output signal at its output terminal 49. The second positive pulse to stage 1 produces a positive output pulse from stage 1 to stage 2 and restores stage 1 to its Off condition. Stage 2 is turned On on the second input pulse and remains On until the fourth input pulse, which turns it Off and turns stage 3 On. It may, therefore, be seen that the three binary trigger stages 1, 2 and 3 will count eight pulses. At the end of the seventh pulse, the stages 1, 2 and 3 are all On. When the eighth pulse is received, stage 1 turns Off and transmits a signal to stage 2 which turns Off and in turn transmits a signal to stage 3, turning it Off. Stage 3 transmits a signal through a wire 50 to input terminal 51 of stage 4. Note that input terminal 51 of stage 4 serves only the transistor 6 and not the transistor 5 of that stage. The input signal at terminal 51 switches the stage 4, turning the transistor 6 Off and the transistor 5 On. The collector 5c of transistor 5 therefore swings in a positive direction, and this change in potential is transmitted through wire 52 and resistor 53 to the junction 53a between capacitor 17 of stage 2 and diode 54.

*Feedback and gate*

Diode 54, resistor 53 and capacitor 17 of stage 2 function as a gate of the type described in U. S. Patent No. 2,580,771, to Harper, previously mentioned. More specifically, when stage 4 is Off, the right hand terminal of resistor 53 is clamped negative by indicator circuit 31 of stage 4, and that negative potential is communicated to junction 53a. Then when a positive signal is received in input terminal 48, that input signal may successfully pass through the diode 54, capacitor 17, and diode 16 to the base 6b in stage 2. However, when the right-hand terminal of resistor 53 is swung positive, as it is when stage 4 is switched On, then junction 53a follows to the same positive potential, which is the same potential as the positive signals appearing at terminal 48. The next positive signal is therefore blocked, and is not transmitted through diode 54 to capacitor 17. Resistor 53 slows the rate of change of potential of junction 53a sufficiently so that not positive signal passes through capacitor 17 of stage 2 when stage 4 is switched On.

Note that output terminal 49 of stage 1, in addition to being connected to input terminal 48 of stage 2, is connected through a wire 55 to input terminal 56 and thence to the base 5b in stage 4. When stage 4 is Off, a positive signal from stage 1 is without effect at stage 4 since transistor 5 of stage 4 is not conducting.

As a result of the connections just described, when the eighth impulse switches stage 4 On, the gate in stage 2 is arranged so that it will block the signal from stage 1 which would otherwise switch stage 2 On at the tenth input impulse. This output signal from stage 1 on the tenth input impulse, altough blocked from stage 2, is transmitted through wire 55 and input terminal 56 to base 5b in stage 4, where it is effective to switch that stage Off, producing an output signal at its terminal 49.

While the feedback arrangement shown decimalizes the output of the counter, in that the circuit is caused to produce an output pulse on the tenth input pulse, it will be recognized that other feedback arrangements may be readily made, within the scope of the invention, to produce other modifications of the normal binary output. For example, if diode 54 and resistor 53 are connected in stage 1 instead of stage 2, and stage 4 is turned Off by the ninth pulse, then the counter produces an output pulse on every ninth input pulse. Alternatively, if diode 54 and resistor 53 are connected in stage 3 instead of stage 2, then the counter produces an output pulse on the twelfth input pulse. If only two stages are used, the feedback may be arranged to produce an output pulse on the third input pulse. In a similar fashion, by selecting properly the number of stages and the particular stage to which the feedback is applied, a counter may be constructed to deliver an output signal on any desired non-binary input pulse.

Note particularly that the switching of the latch stage 4 in response to the tenth input pulse is effective to take the blocking potential off the diode 54, so that the counting circuit is immediately in condition to start a new decimal count, without the necessity of going back with another feedback to reset the blocked stage 2, such as has been necessary in the modified binary counting circuits of the prior art, of which the circuits shown in the Phelps Patent No. 2,584,811 are typical.

*Indicator circuit*

The indicator circuit 31 in each stage illuminates its neon glow lamp 37 whenever the transistor 5 of that stage is On. As explained in the copending application of Logue and Henle referred to above, the transistor 32 is turned On whenever emitter 32e is biased negatively with respect to its base 32b. This occurs when the transistor 5 is Off. The lamp 37 is illuminated whenever the transistor 32 is Off, and is extinguished when transistor 32 is On. When the transistor 32 is Off, the full potential of both batteries 36 and 39 in series is impressed across resistor 34, lamp 37 and resistor 38 in series. When transistor 32 turns On, the current flowing through its collector 32c producing a potential drop across resistor 34 sufficient to reduce the potential at the terminals of lamp 37 below the discharge maintaining potential of that lamp.

*Reset circuits*

One transistor of each stage is provided with a special reset signal input circuit, including a capacitor 42 and a diode 43 in series. When it is desired to reset the counter to a predetermined count, then a series of reset pulses are supplied from a reset generator 66 through reset input terminal 40 and wire 41 to the reset signal inputs of several stages. In stage 1, an input signal through capacitor 42 is effective to cut Off the transistor 6, thereby switching stage 1 to its On condition. In stage 2, reset input capacitor 42 and diode 43 are connected to transistor 5 rather than to transistor 6, so that the same reset signal is effective to switch the stage 2 to its Off condition. Stage 3 is switched to its Off condition like stage 2, while stage 4 is switched to its On condition, all by the same reset signal.

This difference between the stages 2 and 3 on the one hand and stages 1 and 4 on the other hand is provided so that the counter may be reset to its 9 condition rather than to its zero condition. This is done so that the counter may be used for complement subtraction. In case it is desired to reset the counter to zero, all four of the special reset input circuits would be arranged to feed pulses into the transistors 5 of all four stages.

In each of the reset circuits, a resistor 44 is connected between ground and the common junction of capacitor 42 and diode 43, to assist in changing and discharging the capacitor 42 rapidly. Another resistor 45 is connected between that common junction and a wire 46 which leads to the negative terminal of battery 30. Resistors 44 and 45 form a voltage divider which maintains the lower terminal of diode 43 biased slightly negatively, thereby preventing conduction through the diode 43 unless a substantial positive input signal is impressed on it.

When resetting the counter, a series of four input pulses is necessary to insure a complete reset. The number of reset pulses required corresponds to the number of stages. For example, a single reset pulse would reset all four of the stages, but any stage which happened to be On prior to its resetting might, in its resetting, produce an output pulse which would trip the next following stage. On. A second reset pulse would be required to clear that following stage. If a series of four reset pulses is used, it insures that under the worst possible conditions, the counter is completely cleared.

While I have in some instances in this circuit used PNP transistors and in other instances used NPN transistors, it will be readily understood that either type of transistor may be used in place of the other, providing that all signal and battery polarities are reversed, and that all input, clamping, feedback, and gating diodes have the proper polarities. Also, in either PNP or NPN triggers, the collector clamping can be accomplished with either NPN or PNP transistors by appropriately making use of the low impedance emitter, or base, for the clamping action.

The following table shows by way of example, particular values for the potentials of the various batteries and for the impedances of the various resistors and capacitors, in a circuit which has been operated successfully. In some cases, the values are also shown in the drawing. These values are set forth by way of example only, and the invention is not limited to them nor to any of them. The diodes are considered to have substantially no impedance in their forward direction, and substantially infinite impedance in the reverse direction:

*Table 1*

| | | |
|---|---|---|
| Resistor 8 | ohms | 20K |
| Capacitor 9 | mmf | 680 |
| Resistor 10 | ohms | 20K |
| Capacitor 11 | mmf | 680 |
| Capacitor 14 | do | 1000 |
| Capacitor 17 | do | 1000 |
| Resistor 18 | ohms | 240K |
| Resistor 19 | do | 240K |
| Battery 21 | volts | 15 |
| Resistor 22 | ohms | 3K |
| Resistor 23 | do | 3K |
| Resistor 24 | do | 3K |
| Battery 26 | volts | 15 |
| Resistor 27 | ohms | 3K |
| Battery 30 | volts | 5 |
| Resistor 34 | ohms | 39K |
| Battery 36 | volts | 45 |
| Resistor 38 | ohms | 100K |
| Battery 39 | volts | 50 |
| Capacitor 42 | mmf | 1000 |
| Resistor 44 | ohms | 3K |
| Resistor 45 | do | 27K |
| Resistor 53 | do | 5K |
| Resistor 61 | do | 7.5K |
| Capacitor 65 | mmf | 1000 |

While I have shown and described a preferred modification of my invention, other embodiments thereof will readily occur to those skilled in the art, and I therefore intend my invention to be limited only by the appended claims.

What is claimed is:

1. An electronic counter comprising at least one binary trigger stage including two alternately conducting translating devices, a common input terminal, means including separate capacitors connecting said common input terminal and the respective translating devices; means effective to switch said devices from one conducting condition to the alternate condition in response to input signal pulses of a predetermined polarity, and an output terminal whose potential is controlled by the conducting condition of one of said devices; a latch stage comprising a counting translating device, a transmitting translating device, two input terminals, an output terminals, means connecting the respective input terminals and the translating devices, and means cross-connecting the outputs and inputs of the translating devices so that the devices are alternately conducting; means connecting the output terminal of the trigger stage to the input terminal of the transmitting translating device of the latch stage; and means for establishing at an integer other than a power of two the number of input pulses required to produce an output pulse at said latch stage output terminal, said establishing means comprising a diode in said trigger stage connected between the common input terminal thereof and one of the capacitors and poled to pass signal pulses of said predetermined polarity, means including a resistor connecting the counting translating device in the latch stage and the junction of the diode and its associated capacitor, said last-named connecting means being effective when said counting device is in one only of its states of conductivity to bias the diode so as to block input signals entering said one trigger stage, and a connection between the common input terminal of said one trigger stage and the input terminal of the counting translating device in the latch stage, said connection being effective to transmit an input signal blocked from said one trigger stage to the latch stage where it is effective to switch the latch stage and produce an output signal there.

2. An electronic counter as defined in claim 1, in which said translating devices are transistors.

3. An electronic counter comprising a plurality of binary trigger stages connected in cascade, each said trigger stage comprising two alternately conducting translating devices, a common input terminal, means including separate capacitors connecting said common input terminal and the respective translating devices, means effective to switch said devices from one conducting condition to the alternate condition in response to input signal pulses of a predetermined polarity, and an output terminal whose potential is controlled by the conducting condition of one of said devices; a latch stage comprising a counting translating device, a transmitting translating device, two input terminals, an output terminal, means connecting the respective input terminals and the translating devices, and means cross-connecting the outputs and inputs of the translating devices so that the devices are alternately conducting; a main input terminal for the counter, means connecting the main input terminal to the common input terminal of the first trigger stage; means connecting the output terminal of each trigger stage but the last to the common input terminal of the next trigger stage, means connecting the output terminal of the last trigger stage to the input terminal of the transmitting translating device of the latch stage; and means for altering from the binary pattern the number of input pulses required to produce an output pulse at said latch stage output terminal, said altering means comprising a diode in one of said trigger stages connected between the common input terminal thereof and one of the capacitors and poled to pass signal pulses of said predetermined polarity, means including a resistor connecting the counting translating device in the latch stage with the junction of the diode and its associated capacitor, said last-named connecting means being effective when said counting device is in one only of its states of conductivity to bias the diode so as to block input signals entering said one trigger stage, and a connection between the common input terminal of said one trigger stage and the input terminal of the counting translating device in said latch stage, said connection being effective to transmit an input signal blocked from said one trigger stage to the latch stage where it is effective to switch the latch stage and produce an output signal there.

4. An electronic counter as defined in claim 3, in which there are three binary trigger stages, which serve to count eight input pulses, and said means for altering the binary pattern comprises a diode in the second trigger stage, said second trigger stage being blocked by the latch stage, so that the first and fourth stages cooperate to count two input pulses following said eight input pulses, making a total of 10 input pulses counted.

References Cited in the file of this patent

UNITED STATES PATENTS

| | | |
|---|---|---|
| 2,531,076 | Moore | Nov. 21, 1950 |
| 2,540,442 | Grosdoff | Feb. 6, 1951 |
| 2,568,918 | Grosdoff | Sept. 25, 1951 |
| 2,622,213 | Harris | Dec. 16, 1952 |
| 2,623,170 | Dickinson | Dec. 23, 1952 |
| 2,644,887 | Wolfe | July 7, 1953 |
| 2,715,997 | Hill | Aug. 23, 1955 |
| 2,719,228 | Auerbach | Sept. 27, 1955 |
| 2,771,551 | Hampton | Nov. 20, 1956 |